(12) United States Patent
Zhao et al.

(10) Patent No.: US 11,611,051 B2
(45) Date of Patent: Mar. 21, 2023

(54) DISPLAY PANEL AND DISPLAY DEVICE (71) Applicant: BOE TECHNOLOGY GROUP CO., LTD., Beijing (CN)

(72) Inventors: Jia Zhao, Beijing (CN); Pinfan Wang, Beijing (CN); Fangxu Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 17/329,758

(22) Filed: May 25, 2021

(65) Prior Publication Data
US 2022/0085305 A1 Mar. 17, 2022

(30) Foreign Application Priority Data

Sep. 16, 2020 (CN) .......................... 202010975356.2

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2009/0103001 A1 | 4/2009 | Choi | |
| 2012/0081874 A1 | 4/2012 | Wu et al. | |
| 2020/0026332 A1 | 1/2020 | Hong et al. | |
| 2022/0069051 A1* | 3/2022 | Lee | H01L 27/3262 |
| 2022/0077242 A1* | 3/2022 | Yoon | G06F 1/1626 |
| 2022/0085327 A1* | 3/2022 | Kim | H01L 27/3258 |

FOREIGN PATENT DOCUMENTS

| | | |
|---|---|---|
| CN | 105528569 A | 4/2016 |
| CN | 206161888 U | 5/2017 |
| CN | 108447405 A | 8/2018 |

(Continued)

OTHER PUBLICATIONS

First Office Action for CN Patent Application No. 202010973177.5 dated Nov. 2, 2021.

(Continued)

*Primary Examiner* — J. E. Schoenholtz
(74) *Attorney, Agent, or Firm* — Xsensus LLP (57) ABSTRACT

A display panel includes a corner area, and the corner area includes a corner display area, a corner edge area, and a corner wiring area between the corner display area and the corner edge area. The corner area includes: a flexible base layer, having a base groove in the corner wiring area and a plurality of first openings in the corner display area; a display function layer formed on the flexible base layer and located in the corner display area, the display function layer having second openings corresponding to the first openings; a peripheral circuit layer, formed on the flexible base layer and located in the corner wiring area, the peripheral circuit layer including one or more peripheral wirings, the orthographic projection of at least part of the peripheral wirings on the flexible base layer is within the base groove.

20 Claims, 6 Drawing Sheets

(56) References Cited

FOREIGN PATENT DOCUMENTS

| | | |
|---|---|---|
| CN | 108766977 A | 11/2018 |
| CN | 110783498 A | 2/2020 |
| CN | 110854177 A | 2/2020 |
| CN | 110992827 A | 4/2020 |
| CN | 111131570 A | 5/2020 |
| CN | 111341932 A | 6/2020 |
| CN | 111415592 A | 7/2020 |
| CN | 111584595 A | 8/2020 |
| CN | 111584606 A | 8/2020 |
| CN | 111627330 A | 9/2020 |
| CN | 111627332 A | 9/2020 |
| JP | 2002229006 A | 8/2002 |
| KR | 20190085579 A | 7/2019 |

OTHER PUBLICATIONS

First Office Action for CN Patent Application No. 202010973179.4 dated Nov. 1, 2021.

\* cited by examiner

DISPLAY PANEL AND DISPLAY DEVICE

CROSS-REFERENCE TO RELATED APPLICATION

This application is based upon, and claims the benefit of and priority to, Chinese Patent Application No. 202010975356.2, filed Sep. 16, 2020, the entire contents of which are incorporated herein by reference.

TECHNICAL FIELD

The present disclosure relates to the field of display technology and, more particularly, to a display panel and a display device.

BACKGROUND

At present, from a perspective of market trends, flexible display products have become favored objects of electronic devices such as mobile phones and tablet computers. Flexible display products may be designed to match different shape models according to the electronic devices to provide different curved display requirements. When a display panel is attached to a curved cover plate, a corner area of the display panel is prone to have compression wrinkles or cracks, which affects display effect.

It should be noted that the information disclosed in the background section above is only used to enhance the understanding of the background of the present disclosure, and therefore may include information that does not constitute the prior art known to those of ordinary skill in the art.

SUMMARY

An object of the present disclosure is providing a display panel and a display device that can improve the phenomenon of compression wrinkles in a corner area.

According to a first aspect of the present disclosure, there is provided a display panel, including a corner area, the corner area including a corner display area, a corner edge area, and a corner wiring area between the corner display area and the corner edge area, wherein the corner area includes:

a flexible base layer, having a base groove in the corner wiring area and a plurality of first openings in the corner display area;

a display function layer formed on the flexible base layer and located in the corner display area, the display function layer having second openings corresponding to the first openings;

a peripheral circuit layer, formed on the flexible base layer and located in the corner wiring area, the peripheral circuit layer including one or more peripheral wirings, the orthographic projection of at least part of the peripheral wirings on a reference plane is within the orthographic projection of the base groove on the reference plane, the reference plane being a plane perpendicular to a thickness direction of the display panel.

According to a second aspect of the present disclosure, there is provided a display device, including a curved cover plate and the display panel according to any one of the above items, the display panel being attached to the curved cover plate.

It is to be understood that both the foregoing general description and the following detailed description are exemplary and explanatory only and are not restrictive of the present disclosure.

BRIEF DESCRIPTION OF THE DRAWINGS

The drawings herein, which are incorporated in and constitute a part of this specification, illustrate embodiments consistent with the present disclosure, and serve to explain the principles of the present disclosure together with the description. Understandably, the drawings in the following description are just some embodiments of the present disclosure. For those of ordinary skill in the art, other drawings may be obtained based on these drawings without creative efforts.

DETAILED DESCRIPTION

In order to make the objectives, technical solutions, and advantages of the disclosure clear, the embodiments of the present disclosure will be described in detail below with reference to the accompanying drawings. It should be noted that the embodiments can be implemented in a number of different forms. Those of ordinary skill in the technical field can easily understand the fact that the method and content can be transformed into various forms without departing from the purpose and scope of the present disclosure. Therefore, the present disclosure should not be interpreted as being limited to the content described in the following embodiments. In the case of no conflict, the embodiments in the disclosure and the features in the embodiments may be combined with each other arbitrarily.

In the drawings, for the sake of clarity, the size of each constituent element, the thickness of the layer, or the area may be exaggerated. Therefore, an embodiment of the present disclosure is not necessarily limited to this size, and the shape and size of each component in the drawings do not reflect the true ratio. In addition, the drawings schematically show ideal examples, and an embodiment of the present disclosure is not limited to the shapes, numerical values, or the like shown in the drawings.

The ordinal numbers such as "first" and "second" in the specification are set to avoid the confusion of the constituent elements, rather than to limit in terms of quantity.

In the specification, for the sake of convenience, the terms "middle area", "both sides area", "up", "in", "out", and other words indicating the orientation or positional relationship used to explain the positional relationship of the constituent elements with reference to the drawings is only for the convenience of describing the specification and simplifying the description, rather than indicating or implying that the device or element referred to must have a specific orientation, be configured and operated in a specific orientation, and therefore cannot be understood as a limitation of the present disclosure. The positional relationship of the constituent elements is appropriately changed according to the direction in which each constituent element is described. Therefore, it is not limited to the words and sentences described in the specification, and can be changed appropriately according to the situation.

In the specification, unless expressly stipulated and defined otherwise, the terms "connected" and "coupled" should be interpreted broadly. For example, it can be a fixed connection, or a detachable connection, or an integral connection; it can be a mechanical connection or an electrical connection; and it can be a direct connection, or an indirect connection through an intermediate piece, or an internal communication between two components, or an integrally formation of two components. For those of ordinary skill in the art, the specific meaning of the above-mentioned terms in the present disclosure can be understood in specific situations.

In the present disclosure, unless otherwise specified, the used term "arranged in the same layer" means that two layers, components, members, elements, or parts can be formed by the same patterning process, and the two layers, components, members, elements, or parts are generally formed of the same material.

In the present disclosure, unless otherwise specified, the expression "patterning process" generally includes the steps of photoresist coating, exposure, development, etching, photoresist stripping, and the like. The expression "patterning process at one time" means a process of forming patterned layers, components, members, and the like, using one mask.

An embodiment of the present disclosure provides a display panel, which has good flexibility and can be attached to a curved cover plate. The curved cover plate may be a four-sided curved cover plate (that is, a cover plate with four curved sides), but not limited thereto, and it may also be a double-sided curved cover plate (that is, a cover plate with curved long sides). It should be understood that the entire display panel may be flat as a whole before being attached to the curved cover plate.

Figure 1:
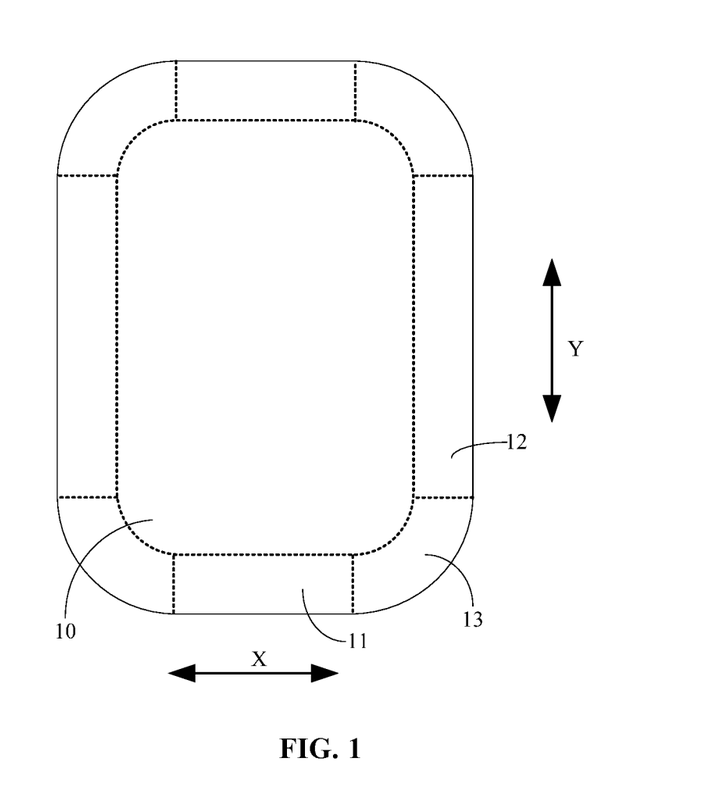
FIG. 1 is a schematic view of a distribution of respective areas in a display panel described in an embodiment of the present disclosure.

As shown in FIG. 1, a display panel of an embodiment of the disclosure may include a main display area 10 and a peripheral area arranged around the main display area 10. The peripheral area may include a first side area 11 extending in a first direction X, a second side area 12 extending in a second direction Y, and a corner area 13 between the first side area 11 and the second side area 12.

Specifically, the peripheral area of the display panel may include two first side areas 11 opposite to each other in the second direction Y, two second side areas 12 opposite to each other in the first direction X, and four corner areas 13.

It should be understood that the aforementioned first direction X, the second direction Y and the thickness direction Z of the display panel are perpendicular to one another.

Figure 2:
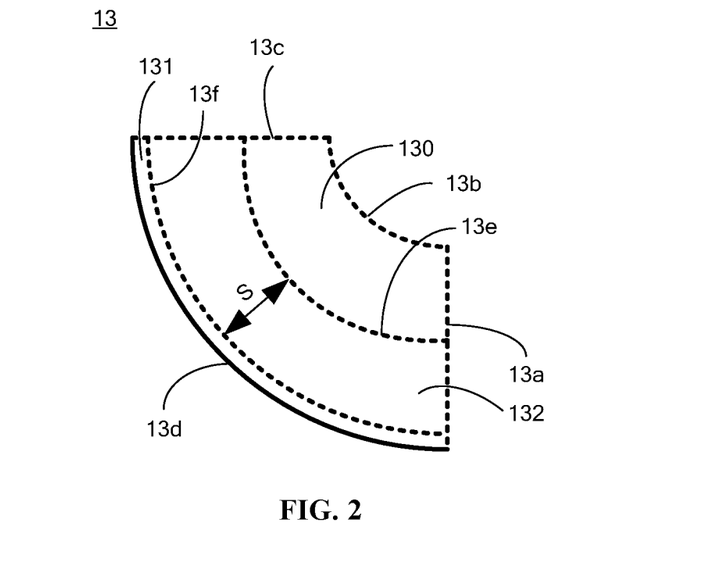
FIG. 2 is a schematic view of a distribution of respective areas in a corner area of the display panel shown in FIG. 1.

As shown in FIG. 1, the first side area 11 and the second side area 12 may be rectangular areas, that is, orthographic projections of the first side area 11 and the second side area 12 on a reference plane may have a rectangular shape. The corner area 13 may be an arc-shaped area, that is, the orthographic projection of the corner area 13 on the reference plane may have an arc shape. As shown in FIG. 2, the orthographic projection of the corner area 13 on the reference plane may include a first straight side 13a, an inner arc side 13b, a second straight side 13c, and an outer arc side 13d that are connected end to end in sequence. The first straight side 13a is the side in the corner area 13 that connects with the first side area 11, the second straight side 13c is the side in the corner area 13 that connects with the second side area 12, the inner arc side 13b is the side in the corner area 13 close to the main display area 10, and the outer arc side 13d is the side in the corner area 13 far away from the main display area 10. For example, the inner arc side 13b may have an arc shape. When the lengths of the first straight side 13a and the second straight side 13c are equal, the outer arc side 13d may also have an arc shape. However, in the embodiment of the disclosure, the lengths of the first straight side 13a and the second straight side 13c may be equal or unequal. Therefore, the outer arc side 13d may have an arc shape or a non-arc shape, depending on the specific situations.

It should be noted that the orthographic projection of the corner area 13 on the reference plane may also have a fan shape That is, compared with the aforementioned arc-shaped corner area 13, the orthographic projection of the fan-shaped corner area 13 on the reference plane does not include the aforementioned inner arc side 13b, but only includes the aforementioned first straight side 13a, the second straight side 13c and the outer arc side 13d. The first straight side 13a, the second straight side 13c and the outer arc side 13d are connected end to end in sequence.

The reference plane mentioned in the embodiment of the disclosure is a plane perpendicular to the thickness direction Z of the display panel.

Furthermore, as shown in FIG. 2, the corner area 13 may further include a corner display area 130, a corner edge area 131, and a corner wiring area 132 between the corner display area 130 and the corner edge area 131. The corner display area 130 is located on a side of the corner wiring area 132 close to the main display area 10, and the corner edge area 131 is located on a side of the corner wiring area 132 far away from the main display area 10. It should be noted that the corner display area 130 and the corner edge area 131 may be a corner non-display area as a whole.

As shown in FIG. 2, the orthographic projection of the corner wiring area 132 on the reference plane may include a first arc side 13e connected with the corner display area 130 and a second arc side 13f connected with the corner edge area 131. It should be noted that the first arc side 13e and the second arc side 13f may have the same shape as the outer arc side 13d or the inner arc side 13b of the corner area 13, but are not limited thereto, that is, the first arc side and the second arc side may have different shapes from the outer arc side or the inner arc side of the corner area. For example, when the outer arc side 13d has an arc shape, the first arc side 13e and the second arc side 13f may also have an arc shape, and the outer arc side 13d, the first arc side 13e and the second arc side 13f correspond to the same circle center.

A dimension S of the corner wiring area 132 in a radial direction of the outer arc side 13d may be from 0.5 mm to 1 mm, that is, a distance between the first arc side 13e and the second arc side 13f in the radial direction of the outer arc side 13d is from 0.5 mm to 1 mm, for example, 0.5 mm, 0.6 mm, 0.7 mm, 0.8 mm, 0.9 mm, 1 mm, and the like. It should be understood that the dimension S of the corner wiring area 132 in the radial direction of the outer arc side 13d defined herein may have such a value range when the display panel is flat as a whole, that is, before the display panel is attached to the curved cover plate. After the display panel is attached to the curved cover plate, the dimension S of the corner wiring area 132 in a radial direction of the outer arc side 13d may be changed according to actual bending requirements.

It should be noted that the radial direction mentioned in the embodiments of the disclosure is a direction of the radius of curvature.

It should also be noted that the first side area 11 and the second side area 12 may also include a side display area, a side wiring area, and a side edge area that are sequentially arranged away from the main display area 10. The aforementioned main display area 10, corner display area 130, and side display area may collectively form the entire display area of the display panel; the aforementioned side wiring area and corner wiring area 132 may collectively form the entire peripheral wiring area of the display panel; and aforementioned side edge area and corner edge area 131 may collectively form the entire edge area of the display panel.

In an embodiment of the present disclosure, the peripheral area of the display panel can be bent so as to be easily attached to the four-sided curved cover plate.

The display panel may include a flexible base layer, a display function layer, a peripheral circuit layer, and an anti-crack wall formed on the flexible base layer.

The display panel of the embodiment of the present disclosure will be described in detail below with reference to the accompanying drawings.

As shown in FIGS. 3 to 6, the flexible base layer 133 implemented in the present disclosure may have a single-layer structure, but is not limited thereto, and may also have a multi-layer structure. For example, the flexible base layer 133 may be made of a material such as polyimide (PI). It should be understood that the flexible base layer 133 has a top surface and a bottom surface opposite to each other in the thickness direction Z, and other film layers of the display panel are formed on the top surface.

A portion of the flexible base layer 133 in the main display area 10 and the corner display area 130 may be provided with a plurality of first openings 1330. It should be understood that the first openings 1330 penetrate through the top surface and the bottom surface of the flexible base layer 133 to further increase its flexibility. In addition, it should be noted that a portion of the flexible base layer 133 in the side display area may also be provided with the plurality of first openings 1330, when the first side area 11 and the second side area 12 include the side display area.

A portion of the flexible base layer 133 in the corner wiring area 132 may be provided with a base groove to increase the flexibility at the corner wiring area 132 and improve its bending deformation ability, but it is not limited thereto, and the flexible base layer 133 may not have the base groove.

It should be understood that when the flexible base layer 133 in the corner wiring area 132 has the base groove, the base groove is opened on the top surface of the flexible base layer 133 and does not penetrate the bottom surface of the flexible base layer 133. Further, it should be noted that when the first side area 11 and the second side area 12 include the side wiring area, a portion of the flexible base layer 133 in the side wiring area may also be provided with the base groove. But it is not limited thereto, and the base groove may not be provided.

Figure 4:
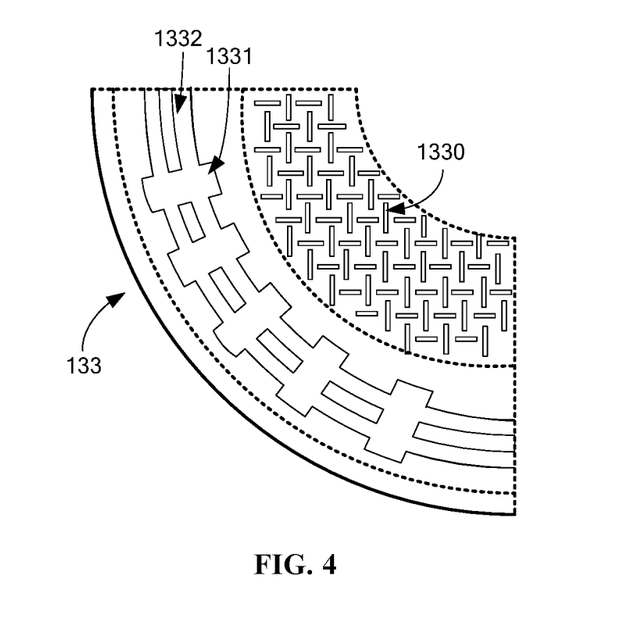
FIG. 4 is a schematically structural view of a flexible base layer in the corner area shown in FIG. 3.

As shown in FIG. 4, the base groove of the embodiment of the disclosure may include a plurality of first grooves 1331 arranged at intervals along a bending direction of the outer arc side 13d and a plurality of second grooves 1332 arranged at intervals along the radial direction of the outer arc side 13d, where the second grooves 1332 communicate with the first grooves 1331. The first grooves 1331 extend in the radial direction of the outer arc side 13d. The orthographic projection of the second grooves 1332 on the reference plane has an arc shape, and corresponds to the same circle center with the outer arc side 13d. Such a design can increase a bending deformation ability of the corner wiring area 132 in its radial and tangential directions.

Figure 5:
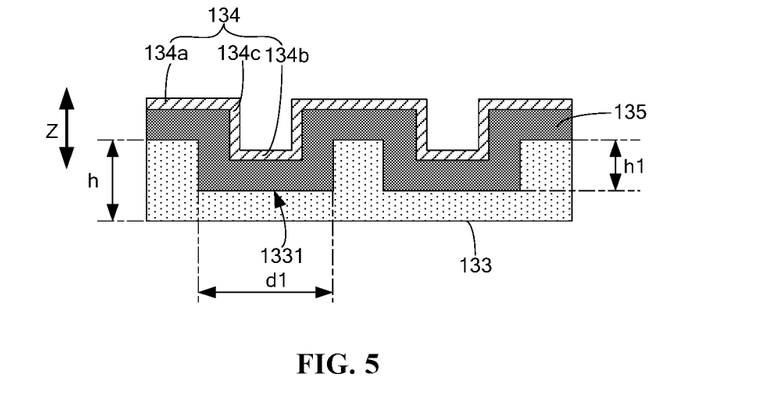
FIG. 5 is a schematic cross-sectional view of the corner area shown in FIG. 3 in a Q-Q direction.
Figure 6:
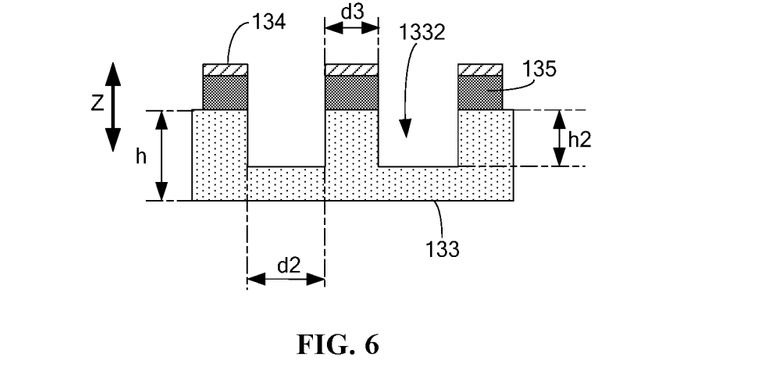
FIG. 6 is a schematic cross-sectional view of the corner area shown in FIG. 3 in a P-P direction.

As shown in FIGS. 5 and 6, a depth h1 of the first grooves 1331 and a depth h2 of the second grooves 1332 are each 25% to 75% of a thickness h of the flexible base layer 133. The depth and thickness mentioned herein are the dimensions in the thickness direction Z. In this way, the bending deformation ability of the corner wiring area 132 can be increased, while ensuring the structural stability of the flexible base layer 133.

For example, the thickness h of the flexible base layer 133 may be from 5 µm to 20 µm, for example, 5 µm, 10 µm, 15 µm, 20 µm, and the like; and the depth h1 of the first grooves 1331 and the depth h2 of the second grooves 1332 may each be from 1.25 µm to 15 µm, for example, 1.25 µm, 3.75 µm, 5 µm, 15 µm, and the like. It should be understood that the thickness range of the flexible base layer 133 and the depth ranges of the first grooves 1331 and the second grooves 1332 defined herein may be the value ranges when the display panel is flat as a whole, that is, before the display panel is attached to the curved cover plate. After the display panel is attached to the curved cover plate, the thickness of the flexible base layer 133 and the depths of the first grooves 1331 and the second grooves 1332 may be changed according to actual bending requirements.

It should be noted that the depth of the first grooves 1331 and the depth of the second grooves 1332 may be the same, but are not limited thereto, and may also be designed to be different, depending on the specific situations. A distance between the adjacent first grooves 1331 may be equal to a width d1 of the first grooves 1331; and a distance between the adjacent second grooves 1332 may be equal to a width d2 of the second grooves 1332.

In addition, it should be noted that the width d1 of the first grooves 1331 is the dimension in a direction perpendicular to its extending direction; and the width d2 of the second grooves 1332 is the dimension in the aforementioned radial direction of the outer arc side 13d.

The display function layer implemented in the disclosure may be located in the main display area 10 and the corner display area 130. It should be understood that when the first side area 11 and the second side area 12 include the side display area, the display function layer may also be located in the side display area. Therefore, it may be understood that the display function layer is located in the entire display area of the display panel.

Since the flexible base layer 133 is provided with the first openings 1330, the display function layer fabricated on the flexible base layer 133 may naturally be formed with second openings corresponding to the first openings 1330. The second openings penetrate the entire display function layer in the thickness direction Z. It should be noted that the first openings 1330 in the flexible base layer 133 and the second openings in the display function layer may also be formed by integrally punching after the complete display panel is manufactured, depending on the specific situations. In addition, when the portions of the flexible base layer 133 in the main display area 10, the corner display area 130, and the side display area are provided with the plurality of first openings 1330, the portions of the display function layer in the main display area 10, the corner display area 130, and the side display area may also have the plurality of second openings.

Figure 3:
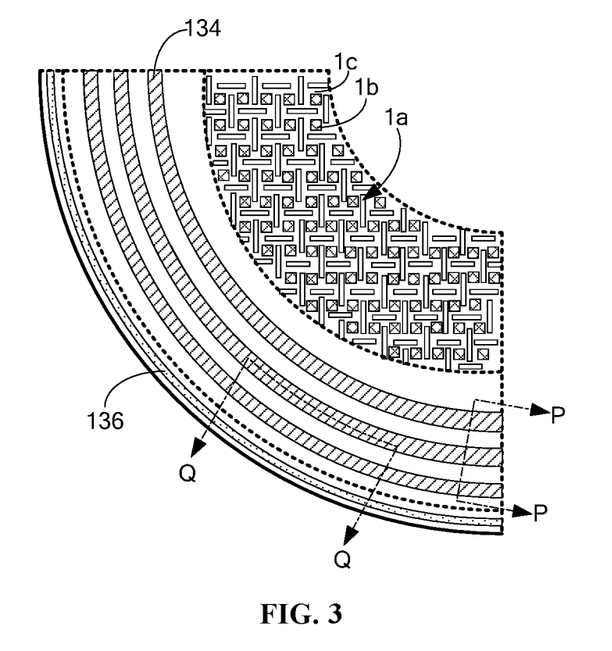
FIG. 3 is a schematically structural view of the corner area shown in FIG. 2.

The orthographic projection of the second openings on the flexible base layer 133 may be completely overlapped with that of the first openings 1330. The first openings 1330 and the second openings may be collectively formed as through holes 1a penetrating the entire display panel, as shown in FIG. 3. In other words, the display panel may be provided with the through holes 1a, and the through holes 1a include the first openings 1330 in the flexible base layer 133 and the second openings in the display function layer.

For example, the portions of the display panel in the main display area 10, the corner display area 130, and the side display area are each provided with the plurality of through holes 1a. The through holes 1a may be "—"-shaped elongated holes, or " T."-shaped holes composed of multiple "—"-shaped elongated holes. When the display panel is not attached to the curved cover plate, the shape and size of the through holes 1a in the main display area 10, the corner display area 130, and the side display area may be the same.

Figure 7:
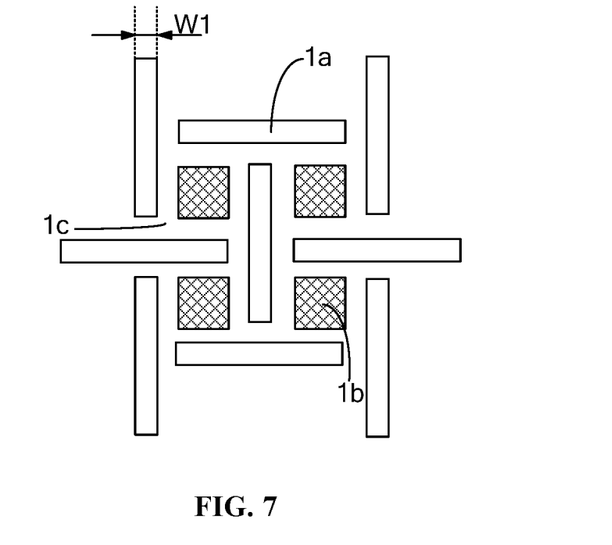
FIG. 7 is a partial schematic view of a main display area, a first sub-area, or a second sub-area in a display panel according to an embodiment of the present disclosure.

As shown in FIGS. 3 and 7, the plurality of through holes 1a divide pixel islands 1b for display and bridges 1c for signal transmission. The bridges 1c include a plurality of signal wirings for signal transmission, and each pixel island 1b may include a plurality of pixels, for example, a red (R) pixel, a green (G) pixel, a blue (B) pixel, and the like. Each pixel may include a display device, the display device may be an OLED display, and the display device may be electrically connected with the signal wirings to perform light-emitting display. For example, the display device may include a driving transistor, an anode, an organic light emitting material layer, a cathode, and the like.

In addition, the display function layer may further include an inorganic insulating layer, an organic insulating layer, and the like, which will not be described in detail here.

In an embodiment of the present disclosure, as shown in FIGS. 3 and 7, the plurality of through holes 1a are arranged around the pixel island 1b; and a part of the bridge 1c is located between the pixel island 1b and the through hole 1a, and the other part is located between the adjacent through holes 1a. In the embodiment of the present disclosure, by providing the plurality of through holes 1a around the pixel island 1b in the entire display area of the display panel, the elastic modulus of the display panel in all directions is relatively small and substantially the same, so as to ensure good tensile and bending deformation ability in all directions.

It should be noted that a pixel density (PPI) of the display panel of the embodiment of the disclosure can reach at least 200.

As shown in FIG. 3, the peripheral circuit layer implemented in the disclosure may be located in the corner wiring area 132. When the first side area 11 and the second side area 12 include the side wiring area, the peripheral circuit layer may also be located in the side wiring area, that is, the peripheral circuit layer may be in the entire peripheral wiring area of the display panel. Specifically, the peripheral circuit layer may include one or more peripheral wirings 134. For example, the peripheral wirings 134 may be arranged in the same layer as the signal wirings of the entire display area of the display panel or source and drain electrodes of the driving transistor.

In an embodiment of the present disclosure, the orthographic projection of at least part of the peripheral wirings 134 in the corner wiring area 132 on the flexible base layer 133 is located in the base groove. The orthographic projection of the peripheral wirings 134 in the corner wiring area 132 on the reference plane may have an arc shape and corresponds to the same circle center with the outer arc side 13d, but is not limited thereto.

The peripheral wirings 134 in the embodiment of the disclosure have a portion between the adjacent second grooves 1332, when the base groove of the flexible base layer 133 is composed of the aforementioned first grooves 1331 and the second grooves 1332, as shown in FIGS. 3 to 6. Specifically, the peripheral wirings 134 in the corner area 13 are integrally located between the adjacent second grooves 1332; and a part of the peripheral wirings 134 may be located in the first grooves 1331, and the other part thereof may be located outside the first grooves 1331.

Specifically, the peripheral wirings 134 in the corner wiring area 132 may have a first portion 134a, a second portion 134b, and a transition portion 134c connecting the first portion 134a and the second portion 134b. The first portion 134a is located between the adjacent first grooves 1331 (that is, outside the first grooves 1331), and the second portion 134b and the transition portion 134c are located in the first grooves 1331.

Since the flexible base layer 133 in the corner wiring area 132 is provided with the aforementioned base groove, the flexible base layer 133 in the corner wiring area 132 has a height difference. When the peripheral wirings 134 are formed on the flexible base layer 133 having the height difference, the peripheral wirings 134 may also have a height difference along with the height difference of the flexible base layer 133. It should be noted that the peripheral wirings 134 may have an integrated structure.

A ratio of the width d1 of the first grooves 1331 to a width d3 of the peripheral wirings 134 may be from 1 to 50, for example, 1, 10, 25, 40, 50, and the like. A ratio of the width d2 of the second grooves 1332 to the width d3 of the peripheral wirings 134 may be from 1 to 15, for example, 1, 5, 10, 15 and the like. It should be understood that the value ranges of the ratio of the width d1 of the first grooves 1331 to the width d3 of the peripheral wirings 134 and the ratio of the width d2 of the second grooves 1332 to the width d3 of the peripheral wirings 134 defined herein are the value ranges when the display panel is flat as a whole, that is, before the display panel is attached to the curved cover plate. After the display panel is attached to the curved cover plate, the ratio of the width d1 of the first grooves 1331 to the width d3 of the peripheral wirings 134 and the ratio of the width d2 of the second grooves 1332 to the width d3 of the peripheral wirings 134 may be changed according to actual bending requirements.

For example, the width d1 of the first grooves 1331 may be from 10 μm to 100 μm, for example, 10 μm, 30 μm, 50 μm, 70 μm, 100 μm, and the like; the width d2 of the second groove 1332 may be from 2 μm to 30 μm, for example, 2 μm, 10 μm, 20 μm, 30 μm, and the like; and the width d3 of the peripheral wirings 134 may be from 2 μm to 10 μm, for example, 2 μm, 5 μm, 8 μm, 10 μm, and the like. It should be noted that the width of the peripheral wirings 134 is the size in the radial direction of the outer arc side 13d.

It should be understood that the value ranges of the width d1 of the first grooves 1331, the width d2 of the second grooves 1332, and the width d3 of the peripheral wirings 134 defined herein may be the value ranges when the display panel is flat as a whole, that is, before the display panel is attached to the curved cover plate. After the display panel is attached to the curved cover plate, the width d1 of the first grooves 1331, the width d2 of the second grooves 1332, and the width d3 of the peripheral wirings 134 may be changed according to actual bending requirements.

In addition, the peripheral circuit layer implemented in the disclosure may further include a peripheral insulating portion 135, and the peripheral insulating portion 135 may be located between the flexible base layer 133 and the peripheral wirings 134. In other words, when manufacturing the display panel, after the flexible base layer 133 is formed, the peripheral insulating portion 135 may be formed first, and then the peripheral wirings 134 may be formed. A part of the peripheral insulating portion 135 may be located between the adjacent first grooves 1331, and the other part thereof may be located in the first grooves 1331. The peripheral insulating portion 135 has a portion between adjacent second grooves 1332. Specifically, the peripheral insulating portion 135 integrally located between adjacent second grooves 1332.

For example, the peripheral insulating portion 135 may be arranged in the same layer as at least a part of inorganic insulating layers (for example, a buffer layer, a gate insulating layer, a passivation layer, and the like) of the entire display area in the display panel.

The anti-crack wall 136 implemented in the disclosure may be located in the corner edge area 131. When the first side area 11 and the second side area 12 include the side edge area, the anti-crack wall 136 may also be in the side edge area. That is, the anti-crack wall 136 may be located on the entire edge area of the display panel. The anti-crack wall 136 surrounds the entire display area of the display panel and is used to prevent cracks generated during a process of cutting the display panel from a template from extending to the display area, thereby ensuring product quality. The anti-crack wall 136 may be provided with multiple turns.

For example, the anti-crack wall 136 may be arranged in the same layer as at least a part of the inorganic insulating layers (for example, the buffer layer, the gate insulating layer, the passivation layer, and the like) of the entire display area of the display panel.

Figure 12:
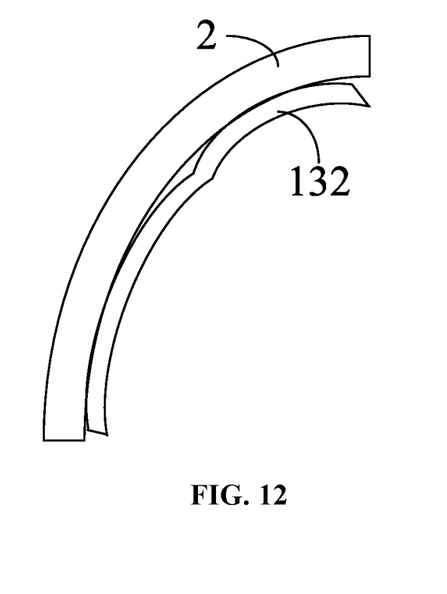
FIG. 12 shows a schematic view of a corner wiring area having a base groove after being attached to a curved cover plate in an embodiment of the present disclosure.
Figure 13:
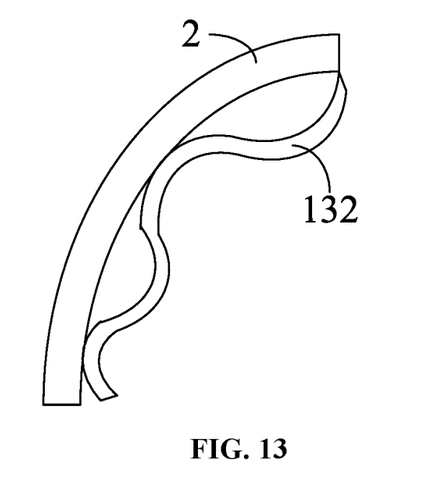
FIG. 13 shows a schematic view of a corner wiring area without a base groove of a display panel after being attached to a curved cover plate in the related art.

Specifically, FIG. 12 shows a schematic view of a corner wiring area 132 having a base groove after being attached to a curved cover plate 2 in an embodiment of the present disclosure; and FIG. 13 shows a schematic view of a corner wiring area 132 without a base groove of a display panel after being attached to the curved cover plate 2 in the related art. By comparing FIG. 12 to FIG. 13, it can be seen that, in the embodiment of the disclosure, the overall elastic modulus of the corner wiring area 132 may be reduced by arranging the base groove in a portion of the flexible base layer 133 which is located in the corner wiring area 132. When the display panel is attached to the curved cover plate, especially when it is attached to the four-sided curved cover plate, the corner wiring area 132 may be bent under stress, such that a wrinkle phenomenon at the corner wiring area 132 can be reduced and a stress concentration phenomenon at the corner wiring area 132 can be alleviated, so as to prevent the peripheral wirings 134 from being easily broken and causing display failure.

An embodiment of the disclosure further provides a display device, which includes a curved cover plate and a display panel attached to the curved cover plate. The display panel may be flat as a whole when not attached to the curved cover plate. For details, please refer to the structure described in any of the foregoing embodiments. After the display panel is attached to the curved cover plate, the entire display panel may have the same curved shape as that of the curved cover plate.

For example, the curved cover plate may be the four-sided curved cover plate, that is, the curved cover plate may include a central area and an edge area surrounding the central area. The central area may be flat, but is not limited thereto. The edge area may include first arc surface areas, second arc surface areas adjacent to the first arc surface areas, and corner spherical surface areas between the first arc surface areas and the second arc surface areas. Two first arc surface areas are provided, and the first arc surface areas are extended in the first direction X; two second arc surface areas are provided, and the second arc surface areas are extended in the second direction Y; and four corner spherical surface areas are provided. It should be noted that the curved cover plate is not limited to the aforementioned shape, and may also have other shapes, for example, only a pair of adjacent two sides in the edge area are curved.

For example, the radius of curvature of the first arc surface area, the second arc surface area, and the corner spherical surface area in the curved cover plate of the embodiment of the disclosure may be from 5 mm to 10 mm, for example, 5 mm, 6 mm, 7 mm, 8 mm, 9 mm, 10 mm, and the like, but not limited to thereto, and it may also be other values.

The main display area 10, the first side area 11, the second side area 12, and the corner area 13 of the aforementioned flat display panel are respectively attached to the central area, the first arc surface area, the second arc surface area, and the corner spherical surface area of the curved cover plate. After the aforementioned flat display panel and the curved cover plate are conformally bonded, the main display area 10 of the display panel may be flat, the first side area 11 and the second side area 12 of the display panel may have an arc shape, and the corner area 13 of the display panel may have a spherically curved shape as a whole.

As mentioned above, the through holes 1a are provided in the entire display area of the display panel, so that the display panel has good deformation ability, so as to improve the wrinkle phenomenon generated in the corner area 13 during the bonding process of the display panel to the curved cover plate.

After the aforementioned flat display panel is attached to the aforementioned curved cover plate, the structure of the corner area 13 of the display panel is changed compared to that before being attached to the curved cover plate, which will be described specifically as below.

Figure 8:
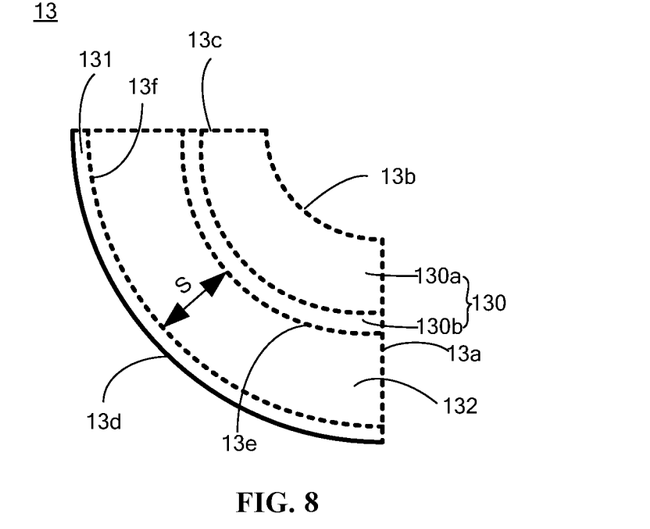
FIG. 8 is another schematic view of a distribution of respective areas in the corner area of the display panel shown in FIG. 1.
Figure 9:
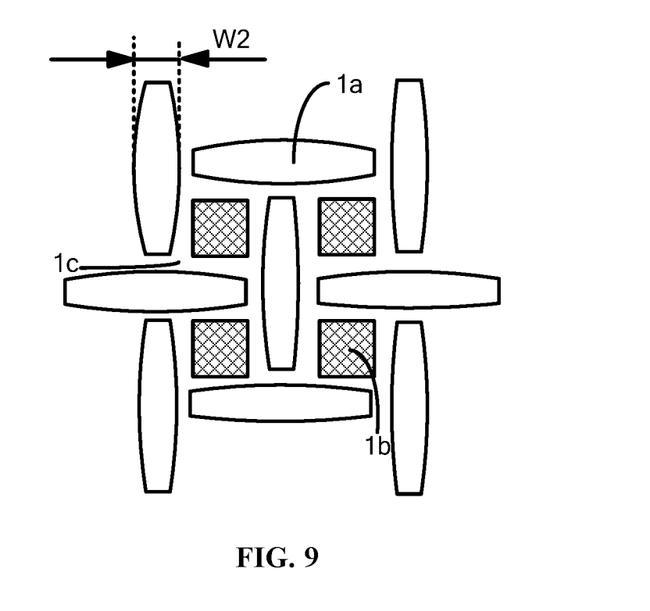
FIG. 9 is a partial schematic view of a first sub-area after a display panel is attached to a curved cover plate according to an embodiment of the disclosure.
Figure 10:
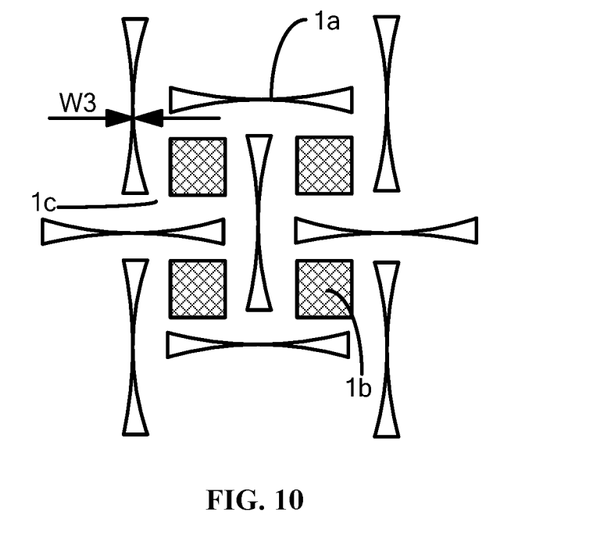
FIG. 10 is a partial schematic view of a second sub-area after a display panel is attached to a curved cover plate according to an embodiment of the disclosure.

As shown in FIG. 8, the corner display area 130 of the display panel in the embodiment of the present disclosure has a first sub-area 130a close to the main display area 10 and a second sub-area 130b far away from the main display area 10. Both the first sub-area 130a and the second sub-area 130b have the aforementioned through holes 1a penetrating the display panel. A plurality of through holes 1a are provided in the first sub-area 130a and the second sub-area 130b, and a plurality of through holes 1a are arranged around the pixel island 1b. Referring to FIG. 7, four through holes 1a may be distributed around each pixel island 1b, and the extending directions of adjacent through holes 1a around each pixel island 1b are perpendicular. After the display panel is attached to the curved cover plate, the first sub-area 130a is stretched, and therefore, the opening area of the through holes 1a becomes larger than that before being attached to the curved cover plate, as shown in FIG. 9; and the second sub-area 130b is compressed, and thus the opening area of the through holes 1a becomes smaller than that before being attached to the curved cover plate, as shown in FIG. 10.

As mentioned above, when the display panel is not attached to the curved cover plate, the through holes 1a in the main display area 10, the corner display area 130, and the side display area have the same shape and size (width and length). Therefore, after the display panel is attached to the curved cover plate, it can be understood that the opening area of the through holes 1a of the first sub-area 130a is larger than the opening area of the through holes 1a of the main display area 10, and the opening area of the through holes 1a of the second sub-area 130b is smaller than the opening area of the through holes 1a of the main display area 10.

In the embodiment of the present disclosure, by arranging the plurality of through holes 1a in the first sub-area 130a and the second sub-area 130b of the corner display area 130, the first sub-area 130a can have good stretching ability and the second sub-area 130b can have good compressibility ability, such that the wrinkle phenomenon generated during the bonding process of the display panel to the curved cover plate may be improved.

Taking the through holes 1a as "—"-shaped elongated holes as an example, when the display panel is not attached to the curved cover plate (as shown in FIG. 1), a first width and a second width of the through holes 1a may each be from 10 μm to 30 μm, for example, 10 μm, 15 μm, 20 μm, 25 μm, 30 μm, and the like. A length of the through holes 1a in the extending direction thereof may be from 200 μm to 1000 μm, for example, 200 μm, 400 μm, 600 μm, 800 μm, 1000 μm, and the like.

It should be noted that the first width mentioned in the present disclosure is the width at the center of the through holes 1a, and the second width is the width at the edge of the through holes 1a in the extending direction thereof. In addition, it should be noted that when the display panel is not attached to the curved cover plate, the through holes 1a have the same width everywhere in the extending direction thereof, that is, the first width and the second width of the through holes 1a may be equal.

After the display panel is attached to the curved cover plate, the first width of the through holes 1a of the first sub-area 130a and the first width of the through holes 1a of the second sub-area 130b may be greatly changed, so that the area of the through holes 1a of the first sub-area 130a and the area of the through holes 1a of the second sub-area 130b are changed. It should be noted that after the display panel is attached to the curved cover plate, the length of the through holes 1a substantially does not change. Therefore, in the embodiment of the disclosure, the change in the length of the through holes 1a is not used to consider the change in the area of the through holes 1a, and only the change in the width of the through holes 1a is used to consider the change in the area of the through holes 1a.

Before the display panel is attached to the curved cover plate, the first width of the through holes 1a in the main display area 10, the first sub-area 130a, and the second sub-area 130b may be W1, as shown in FIG. 7. After the display panel is attached to the curved cover plate, the first width of the through holes 1a of the first sub-area 130a may be W2, as shown in FIG. 9; and the first width of the through holes 1a of the second sub-area 130b may be W3, as shown in FIG. 10. A ratio of W2 to W1 is from 1.1 to 1.5. That is, the width of the through holes 1a of the first sub-area 130a in the display panel is increased by 10% to 50% compared with that before the display panel is attached to the curved cover plate. A ratio of W3 to W1 is greater than or equal to 0 and less than 1. For example, when W1 is 20 μm, W2 may be from 22 μm to 30 μm, e.g., 22 μm, 24 μm, 26 μm, 28 μm, 30 μm, and the like. W3 is greater than or equal to 0 and less than 20 μm.

Further, after the display panel is attached to the curved cover plate, a ratio of the second width of the through holes 1a of the first sub-area 130a to the second width of the through holes 1a of the main display area 10 is from 0.8 to 1.2, for example, 0.8, 1, 1.2, and the like. A ratio of the second width of the through holes 1a of the second sub-area 130b to the second width of the through holes 1a of the main display area 10 is from 0.8 to 1.2, for example, 0.8, 1, 1.2, and the like.

It should be noted that after the display panel is attached to the curved cover plate, in the extending direction of the through holes 1a, the width of the through holes 1a of the first sub-area 130a gradually increases from the edge to the center thereof, as shown in FIG. 9. After the display panel is attached to the curved cover plate, in the extending direction of the through holes 1a, the width of the through holes 1a of the second sub-area 130b gradually decreases from the edge to the center thereof, as shown in FIG. 10.

It should also be noted that after the display panel is attached to the curved cover plate, the width of the through holes 1a of the main display area 10 is substantially unchanged.

In addition, since the plurality of through holes 1a are provided in the first sub-area 130a and the second sub-area 130b of the corner display area 130, the stretching deformation ability of the corner area 13 of the display panel can be improved. In this way, after the display panel is attached to the curved cover plate, the overall area of the corner area 13 in the display panel becomes larger than that before the display panel is attached to the curved cover plate, such that the display panel may be better attached to the curved cover plate, so as to improve the wrinkle phenomenon generated during the bonding process of the display panel to the curved cover plate.

Figure 11:
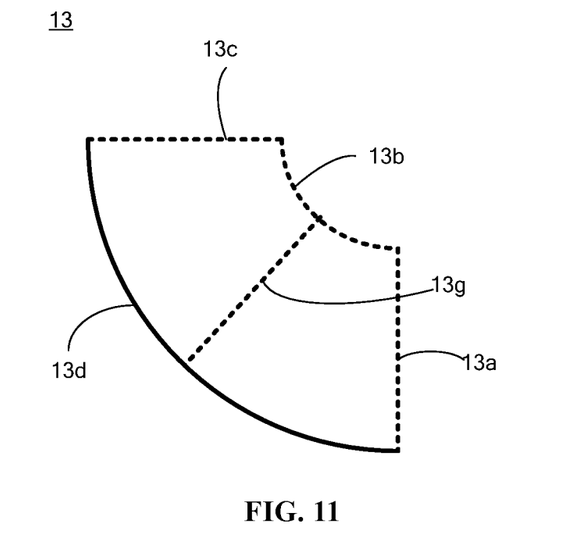
FIG. 11 shows a schematic view of a position of a middle side of the corner area of the display panel shown in FIG. 1.

In detail, after the display panel is attached to the curved cover plate, the first straight side 13a, the second straight side 13c, and a middle side 13g of the corner area 13 in the display panel (as shown in FIG. 11) have a certain stretching deformation, compared with that before the display panel is attached to the curved cover plate. It should be noted that the middle side 13g mentioned herein is the side that extends in the radial direction of the inner arc side 13b, passes through the center of the corner area 13, and has two ends respectively connected with the inner arc side 13b and the outer arc side 13d.

Before the display panel is attached to the curved cover plate, the length of the first straight side 13a of the corner area 13 in the display panel is A, the length of the second straight side 13c is B, and the length of the middle side 13g is C. After the display panel is attached to the curved cover plate, the length of the first straight side 13a of the corner area 13 in the display panel is A1, the length of the second straight side 13c is B1, and the length of the middle side 13g is C1. The ratio between A1 and A, the ratio between B1 and B, and the ratio between C1 and C may be from 1.005 to 1.05. That is, after the display panel is attached to the curved cover plate, the length of the first straight side 13a of the corner area 13 in the display panel has an elongation of 0.5% to 5% than that before the display panel is attached to the curved cover plate. The length of the second straight side 13c of the corner area 13 in the display panel has an elongation of 0.5% to 5% than that before the display panel is attached to the curved cover plate. The length of the middle side 13g of the corner area 13 in the display panel has an elongation of 0.5% to 5% than that before the display panel is attached to the curved cover plate.

In the embodiment of the present disclosure, since the length of the first straight side 13a, the length of the second straight side 13c, and the length of the middle side 13g of the corner area 13 in the display panel have the above elongation, the corner area 13 of the display panel may have a large amount of stretching deformation. Therefore, the corner area 13 of the display panel can be better attached to the curved cover plate, such that the wrinkle phenomenon generated during the bonding process of the display panel to the curved cover plate can be improved.

In addition, after the display panel is attached to the curved cover plate, the outer arc side 13d of the corner area 13 in the display panel may have a certain amount of compression or stretching.

Before the display panel is attached to the curved cover plate, an arc length of the outer arc side 13d of the corner area 13 in the display panel is L. After the display panel is attached to the curved cover plate, the arc length of the outer arc side 13d of the corner area 13 in the display panel is L1, and a ratio of L1 to L may be greater than or equal to 90%. It should be noted that when the ratio of L1 to L is greater than or equal to 90% and less than 100%, it means that after the display panel is attached to the curved cover plate, the outer arc side 13d of the corner area 13 in the display panel may be in the compressed state, having the compression amount less than 10%. When the ratio of L1 to L is greater than 100%, it means that after the display panel is attached to the curved cover plate, the outer arc side 13d of the corner area 13 in the display panel may be in the stretched state.

It should be noted that the above radius of curvature of the first arc surface area, the second arc surface area, and the corner spherical surface area in the curved cover plate may be from 5 mm to 10 mm. In the embodiment, after the display panel is attached to the curved cover plate, the length of the first straight side 13a, the length of the second straight side 13c, and the length of the middle side 13g of the corner area 13 in the display panel may be from 2 mm to 7 mm, for example, 2 mm, 3 mm, 4 mm, 5 mm, 6 mm, 7 mm, and the like. The length of the outer arc side 13d is from 10 mm to 15 mm, for example, 10 mm, 11 mm, 12 mm, 13 mm, 14 mm, 15 mm, and the like, but not limited thereto.

A set of experiments shows that before the display panel of the embodiment of the disclosure is attached to the curved cover plate, the length A of the first straight side 13a of the corner area 13 in the display panel may be 5.1 mm, the length B of the second straight side 13c may be 5.55 mm, and the length C of the middle side 13g may be 4.03 mm. At this time, the arc length L of the outer arc side 13d of the corner area 13 may be 12.10 mm, and the area of the corner area 13 may be 36.89 mm$^2$.

After the display panel according to the embodiment of the disclosure is attached to the curved cover plate, for example, the length of the first straight side 13a, the length of the second straight side 13c, and the length of the middle side 13g of the corner area 13 have an elongation of 3%. After the display panel of the embodiment of the disclosure is attached to the curved cover plate, the length A1 of the first straight side 13a of the corner area 13 in the display panel may be 5.25 mm, the length B1 of the second straight side 13c may be 5.72 mm, and the length C1 of the middle side 13g may be 4.15 mm. At this time, the arc length L1 of the outer arc side 13d of the corner area 13 may be 12.15 mm, and the area of the corner area 13 may be 39.12 mm$^2$. The compression ratio of the outer arc side 13d after being attached may be about 0.4%, and the calculation formula of the compression ratio is $(L-L1)/L$. It should be noted that if the compression ratio is negative, it means that the outer arc side 13d is in the stretched state after being attached; and if the compression ratio is positive, it means that the outer arc side 13d is in the compressed state after being attached.

It can be seen that after the display panel of the embodiment of the disclosure is attached to the curved cover plate, the area of the corner area 13 is increased compared to that before being attached to the curved cover plate. That is, the corner area 13 after being attached may be in the stretched state; and the arc length of the outer arc side 13d is also increased, that is, the outer arc side 13d after being attached may be in the stretched state. Therefore, the wrinkle phenomenon of the corner area 13 after the display panel is attached to the curved cover plate can be improved.

According to another set of experiments, the display panel in the related art does not have the through holes 1a mentioned in the embodiment of the disclosure, nor does it have the base groove mentioned in the previous embodiment. It should be noted that this display panel does not have the ability of stretching or compression, or has weak ability of stretching or compression. Before the display panel having weak ability of stretching or compression is attached to the curved cover plate, the length of the first straight side 13a of the corner area 13 in the display panel may be 5.1 mm, the length of the second straight side 13c may be 5.55 mm, and the length of the middle side 13g may be 4.03 mm. At this time, the arc length of the outer arc side 13d of the corner area 13 may be 12.10 mm, and the area of the corner area 13 may be 36.89 mm$^2$. After the display panel having weak ability of stretching or compression is attached to the curved cover plate, the length of the first straight side 13a, the length of the second straight side 13c, and the length of the middle side 13g of the corner area 13 in the display panel remain substantially unchanged, but at this time, the theoretical arc length of the outer arc side 13d of the corner area 13 needs to be compressed to 11.94 mm. That is, the compression ratio of the outer arc side 13d after being attached may be 1.3%, and the area of the corner area 13 needs to be compressed to 36.77 mm$^2$. However, due to the weak ability of stretching or compression of this display panel, larger wrinkles may occur, which affects product performance.

It can be known from the above two sets of experiments that in the embodiment of the disclosure, through holes 1a are provided in the corner area 13 of the display panel, so that the corner area 13 has the ability to stretch and deform, thereby improving the wrinkle phenomenon in the corner area 13.

The display device of the embodiment of the disclosure may further include an optical film and a protective back film with good flexibility. The optical film may be located on the side of the display panel facing the curved cover plate, and the protective back film may be located on the side of the display panel away from the curved cover plate.

In the embodiment of the disclosure, the specific type of the display device is not particularly limited. The types of the display device commonly used in the art may be possible, for example, mobile phones, tablets, watches, and the like. Those skilled in the art can make a corresponding selection according to the specific use of the display device, which will not be repeated here.

It should be noted that, in addition to the display panel, the display device includes other necessary parts and components such as a displayer, e.g., a housing, a circuit board, a power line, and the like. Those skilled in the art can make corresponding supplements according to the specific usage requirements of the display device, which will not be repeated here.

In addition, an embodiment of the present disclosure further provides a manufacturing method of a display device, including:

step S100, providing a curved cover plate (it should be understood that the curved cover plate may be the four-sided curved cover plate described in the foregoing embodiment, and will not be described in detail here);

step S102, providing a display panel, which is the flat display panel described in any of the foregoing embodiments, and will not be described in detail here; and step S104, attaching the display panel to the curved cover plate.

It should be noted that, after the display panel is attached to the curved cover plate, the display panel may have the structure that is described in any of the foregoing embodiments, which will not be repeated here.

In one embodiment, step S104 may specifically include: attaching the main display area 10 of the display panel to the central area of the curved cover plate; and then moving the peripheral area of the display panel towards the edge area of the curved cover plate, such that the peripheral area of the display panel is attached to the edge area of the curved cover plate, that is, attaching the first side area 11, the second side area 12, and the corner area 13 of the display panel are to the first arc surface area, the second arc surface area, and the corner spherical surface area of the curved cover plate, respectively.

In another embodiment, step S104 may specifically include first stretching the corner area 13 of the display panel, where the stretching amount of the corner area 13 is 0.5% to 5%. It should be noted that, at this time, the first side area 11 and the second side area 12 may also have a certain stretching amount, and the stretching amount of the first side area 11 and the second side area 12 is less than the stretching amount of the corner area 13. Step S104 may further include, then, attaching the stretched main display area 10, the stretched first side area 11, and the stretched second side area 12 of the display panel to the curved cover plate. That is, attaching the stretched main display area 10, the stretched first side area 11, and the stretched second side area 12 of the display panel to the center area, the first arc surface area, and the second arc surface area of the curved cover plate, respectively. Step S104 may further include, then, stretching the corner non-display area of the display panel towards the outer contour line of the curved cover plate, and attaching the corner non-display area to the curved cover plate, that is, attaching the corner non-display area to the edge portion away from the center area in the corner spherical area in the curved cover plate; after the corner non-display area is attached to the curved cover plate, attaching the corner display area 130 of the display panel to the curved cover plate, that is, attaching the corner display area 130 to the edge portion close to the center area in the corner spherical area in the curved cover plate, to complete the bonding of the display panel and the curved cover plate. At this time, the stretching amount of the corner area 13 is 0.5% to 5%.

It should be understood that the overall stretching amount of the corner area 13 after the display panel is attached to the curved cover plate is greater than that of the corner area before the display panel is attached to the curved cover plate.

After considering the specification and practicing the invention disclosed herein, those skilled in the art will easily contemplate other embodiments of the present disclosure. The disclosure is intended to cover any variations, uses, or adaptive changes of the present disclosure. These variations, uses, or adaptive changes follow the general principles of the present disclosure and include the common knowledge or conventional technical means in the technical field not disclosed in the disclosure. The description and the embodiments are only regarded as exemplary, and the true scope and spirit of the present disclosure are pointed out by the appended claims.

What is claimed is:

1. A display panel, comprising:
a corner area, the corner area comprising a corner display area, a corner edge area, and a corner wiring area between the corner display area and the corner edge area, wherein the corner area comprises:
 a flexible base layer having a base groove in the corner wiring area and a plurality of first openings in the corner display area;
 a display function layer formed on the flexible base layer and located in the corner display area, the display function layer having second openings corresponding to the first openings;
 a peripheral circuit layer formed on the flexible base layer and located in the corner wiring area, the peripheral circuit layer comprising one or more peripheral wirings, an orthographic projection of at least part of the peripheral wirings on a reference plane is within an orthographic projection of the base groove on the reference plane, the reference plane being a plane perpendicular to a thickness direction of the display panel.

2. The display panel according to claim 1, wherein:
the display panel further comprises a main display area, a first side area on both sides of the main display area in a second direction, and a second side area on both sides of the main display area in a first direction, and the first direction, the second direction and the thickness direction are perpendicular to one another; and
the corner area is disposed between any adjacent first side area and second side area, and the corner display area is located on a side of the corner wiring area close to the main display area.

3. The display panel according to claim 2, wherein:
the first side area and the second side area comprise a side display area, a side edge area on a side of the side display area away from the main display area, and a side wiring area between the side display area and the side edge area;

the main display area, the corner display area, the side display area of the first side area, and the side display area of the second side area form a display area of the display panel;

the corner wiring area, the side wiring area of the first side area, and the side wiring area of the second side area form a peripheral wiring area of the display panel; and the corner edge area, the side edge area of the first side area, and the side edge area of the second side area form an edge area of the display panel.

4. The display panel according to claim 2, wherein:

an orthographic projection of the corner area on the reference plane comprises an outer arc side; and in the corner area, an orthographic projection of the peripheral wirings on the reference plane has an arc shape and corresponds to a same circle center with the outer arc side.

5. The display panel according to claim 1, wherein:

the base groove comprises a plurality of first grooves arranged at intervals along a bending direction of the corner area and a plurality of second grooves arranged at intervals along a radial direction of the corner area, and the second grooves communicate with the first grooves; the first grooves extend in the radial direction of the corner area; an orthographic projection of the second groove on the reference plane has an arc shape;

the peripheral wirings have a first portion, a second portion, and a transition portion connecting the first portion and the second portion; the first portion is located between the adjacent first grooves, and the second portion and the transition portion are located in the first grooves; and the peripheral wirings have a portion between the adjacent second grooves.

6. The display panel according to claim 5, wherein a depth of the first grooves and a depth of the second grooves are each 25% to 75% of a thickness of the flexible base layer.

7. The display panel according to claim 6, wherein the depth of the first grooves is equal to the depth of the second grooves.

8. The display panel according to claim 5, wherein a ratio of a width of the first grooves to a width of the peripheral wirings is from 1 to 50.

9. The display panel according to claim 5, wherein a ratio of a width of the second grooves to a width of the peripheral wirings is from 1 to 15.

10. The display panel according to claim 5, wherein a distance between the adjacent first grooves is equal to a width of the first grooves; and a distance between the adjacent second grooves is equal to a width of the second grooves.

11. The display panel according to claim 5, wherein the peripheral circuit layer further comprises a peripheral insulating portion, the peripheral insulating portion is between the flexible base layer and the peripheral wirings; and wherein a part of the peripheral insulating portion is between the adjacent first grooves and the other part thereof is in the first grooves, and the peripheral insulating portion has a portion between the adjacent second grooves and outside the second grooves.

12. A display device, comprising:

a curved cover plate and a display panel, wherein the display panel is attached to the curved cover plate and comprises a corner area, the corner area comprising a corner display area, a corner edge area, and a corner wiring area between the corner display area and the corner edge area, wherein the corner area comprises:

a flexible base layer having a base groove in the corner wiring area and a plurality of first openings in the corner display area;

a display function layer formed on the flexible base layer and located in the corner display area, the display function layer having second openings corresponding to the first openings; and a peripheral circuit layer formed on the flexible base layer and located in the corner wiring area, the peripheral circuit layer comprising one or more peripheral wirings, an orthographic projection of at least part of the peripheral wirings on a reference plane is within an orthographic projection of the base groove on the reference plane, the reference plane being a plane perpendicular to a thickness direction of the display panel.

13. The display device according to claim 12, wherein:

the display panel further comprises a main display area, a first side area on both sides of the main display area in a second direction, and a second side area on both sides of the main display area in a first direction, and the first direction, the second direction and the thickness direction are perpendicular to one another; and the corner area is disposed between any adjacent first side area and second side area, and the corner display area is located on a side of the corner wiring area close to the main display area.

14. The display device according to claim 13, wherein:

the first side area and the second side area comprise a side display area, a side edge area on a side of the side display area away from the main display area, and a side wiring area between the side display area and the side edge area;

the main display area, the corner display area, the side display area of the first side area, and the side display area of the second side area form a display area of the display panel;

the corner wiring area, the side wiring area of the first side area, and the side wiring area of the second side area form a peripheral wiring area of the display panel; and the corner edge area, the side edge area of the first side area, and the side edge area of the second side area form an edge area of the display panel.

15. The display device according to claim 13, wherein:

an orthographic projection of the corner area on the reference plane comprises an outer arc side; and in the corner area, an orthographic projection of the peripheral wirings on the reference plane has an arc shape and corresponds to a same circle center with the outer arc side.

16. The display device according to claim 12, wherein:

the base groove comprises a plurality of first grooves arranged at intervals along a bending direction of the corner area and a plurality of second grooves arranged at intervals along a radial direction of the corner area, and the second grooves communicate with the first grooves; the first grooves extend in the radial direction of the corner area; an orthographic projection of the second groove on the reference plane has an arc shape;

the peripheral wirings have a first portion, a second portion, and a transition portion connecting the first portion and the second portion; the first portion is located between the adjacent first grooves, and the second portion and the transition portion are located in the first grooves; and the peripheral wirings have a portion between the adjacent second grooves.

17. The display device according to claim 16, wherein a depth of the first grooves and a depth of the second grooves are each 25% to 75% of a thickness of the flexible base layer.

18. The display device according to claim 17, wherein the depth of the first grooves is equal to the depth of the second grooves.

19. The display device according to claim 16, wherein a distance between the adjacent first grooves is equal to a width of the first grooves; and a distance between the adjacent second grooves is equal to a width of the second grooves.

20. The display device according to claim 16, wherein:
the peripheral circuit layer further comprises a peripheral insulating portion, the peripheral insulating portion is between the flexible base layer and the peripheral wirings; and
a part of the peripheral insulating portion is between the adjacent first grooves and the other part thereof is in the first grooves, and the peripheral insulating portion has a portion between the adjacent second grooves and outside the second grooves.

* * * * *